US006674617B2

(12) United States Patent
Gill

(10) Patent No.: US 6,674,617 B2
(45) Date of Patent: Jan. 6, 2004

(54) TUNNEL JUNCTION SENSOR WITH A MULTILAYER FREE-LAYER STRUCTURE

(75) Inventor: Hardayal Singh Gill, Palo Alto, CA (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 10/094,243

(22) Filed: Mar. 7, 2002

(65) Prior Publication Data

US 2003/0169542 A1 Sep. 11, 2003

(51) Int. Cl.[7] .................................................. G11B 5/39
(52) U.S. Cl. ................................ 360/324.12; 360/324.2
(58) Field of Search ........................ 360/324.1, 324.11, 360/324.12, 324.2

(56) References Cited

U.S. PATENT DOCUMENTS

| | | | |
|---|---|---|---|
| 5,595,830 A | 1/1997 | Daughton | 428/611 |
| 5,648,885 A | 7/1997 | Nishioka et al. | 360/324.12 |
| 5,849,422 A | 12/1998 | Hayashi | 428/611 |
| 5,930,085 A | 7/1999 | Kitade et al. | 360/324.11 |
| 6,127,045 A | 10/2000 | Gill | 428/611 |
| 6,153,319 A | 11/2000 | Hasegawa | 428/692 |
| 6,168,860 B1 | 1/2001 | Daughton | 428/332 |
| 6,301,089 B1 * | 10/2001 | Saito et al. | 360/324.12 |
| 6,466,417 B1 * | 10/2002 | Gill | 360/324.12 |
| 6,608,740 B2 * | 8/2003 | Tanaka et al. | 360/324.12 |
| 2001/0004307 A1 * | 6/2001 | Saito et al. | 360/324.12 |
| 2001/0055185 A1 * | 12/2001 | Ooshima et al. | 360/324.12 |
| 2002/0126427 A1 * | 9/2002 | Gill | 360/324.12 |
| 2002/0126428 A1 * | 9/2002 | Gill | 360/324.12 |
| 2002/0191348 A1 * | 12/2002 | Hasegawa et al. | 360/314 |

FOREIGN PATENT DOCUMENTS

| | | | |
|---|---|---|---|
| JP | 7211956 | B2 | 8/1995 |
| JP | 10198926 | B2 | 7/1998 |
| JP | 10302227 | B2 | 11/1998 |
| JP | 11354860 | | 12/1999 |
| JP | 2000-057527 | A1 | 2/2000 |
| JP | 2000123327 | B2 | 4/2000 |
| JP | 2000-215414 | | 8/2000 |
| JP | 2000-215414 | A * | 8/2000 |

OTHER PUBLICATIONS

W.H. Butler, et al., "Spin–dependent tunneling conductance of Fe/MgO/Fe sandwiches"; Physical Review B., vol. 63 054416, pp. 1–12, Jan. 8, 2001.

W. Wulfhekel, et al., "Single–crystal magnetotunnel junctions", Applied Physics Letter, vol. 78, No. 4, pp. 509–511, Jan. 22, 2001.

J. Mathon, et al., "Theory of tunneling magnetoresistance of an epitaxial Fe/MgO/Fe(001) junction", Physical Review B., vol. 63 220403(R), pp. 1–4, May 10, 2001.

IBM, "GMR sensor with 'Ni' containing pinned and nano ferromagnetic layers", Research Disclosure, 434137, Jun. 2000, 1124.

* cited by examiner

Primary Examiner—Jefferson Evans
(74) Attorney, Agent, or Firm—G. Marlin Knight

(57) ABSTRACT

A tunnel junction sensor according to the invention replaces the prior art free layer with a free layer structure which allows a wider range of magnetoresistive materials to be used. The preferred free layer structure of the invention includes a negative magnetostriction layer which allows use of magnetoresistive materials which otherwise have unacceptably high magnetostriction values. The materials and thicknesses of the layers are selected to result in a total magnetostriction near zero even though magnetoresistive material with high magnetostriction is included. The preferred embodiment includes a softening layer of material such as selected compositions of nickel-iron which maintain the desired magnetic softness of the free layer structure and have a magnetostriction constant near zero.

26 Claims, 3 Drawing Sheets

TUNNEL JUNCTION SENSOR WITH A MULTILAYER FREE-LAYER STRUCTURE

FIELD OF THE INVENTION

The invention relates to the field of magnetoresistive sensors (heads) and more particularly to magnetoresistive heads used in data storages systems and even more particularly to magnetic tunnel junction (MTJ) heads.

BACKGROUND OF THE INVENTION

A typical prior art head and disk system 10 is illustrated in FIG. 1. In operation the head 20 is supported by the suspension 13 as it flies above the disk 16. The magnetic sensor, usually called a "head," is composed of elements that perform the task of writing magnetic transitions (the write head 23) and reading the magnetic transitions (the read head 12). The electrical signals to and from the read and write heads 12, 23 travel along conductive paths (leads) 14 which are attached to or embedded in the suspension 13. Typically there are two electrical contact pads (not shown) each for the read and write heads 12, 23. Wires or leads 14 are connected to these pads and routed in the suspension 13 to the arm electronics (not shown). The disk 16 is attached to a spindle 18 that is driven by a spindle motor 24 to rotate the disk 16. The disk 16 comprises a substrate 26 on which a plurality of thin films 21 are deposited. The thin films 21 include ferromagnetic material in which the write head 23 records the magnetic transitions in which information is encoded. The read head 12 reads magnetic transitions as the disk rotates under the air-bearing surface of the head 20.

There are several types of read heads 12, which are called transducers and sensors interchangably, including those using spin valves and tunnel junctions. Heads using spin valves are called GMR heads. The basic structure of a spin valve sensor (not shown) includes thin films for an antiferromagnetic layer, a pinned layer and a free layer. The spin valve effect is a result of differential switching of two weakly coupled ferromagnetic layers. Magnetic tunnel junction (MTJ) devices. The MTJ device has potential applications as a memory cell and as a magnetic field sensor. The prior art MTJ device shown in FIG. 2 shows a section of a read head 12 with an MTJ thin film layer structure comprises a pinned ferromagnetic layer (pinned layer) 34 and a free ferromagnetic layer (free layer) 36 separated by a thin, electrically insulating, tunnel barrier layer 35. The tunnel barrier layer 35 is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetic moments, or magnetization directions, of the two ferromagnetic layers. When an electric potential is applied between the pinned and free ferromagnetic layers, the sensor resistance is a function of the tunneling current across the insulating layer between the ferromagnetic layers. Recorded data can be read from a magnetic medium because the signal field causes a change of direction of magnetization of the free layer, which in turn causes a change in resistance of the MTJ sensor and a corresponding change in the sensed current or voltage.

The magnetization of the pinned layer 34 is fixed through exchange coupling with the antiferromagnetic (AFM) layer 33. The cap layer 37 separates the free layer 36 from the first lead 31A. The tunnel barrier layer 35 is a nonmagnetic, electrically insulating material such as aluminum (III) oxide ($Al_2O_3$), aluminum (III) nitride (AlN) and magnesium (II) oxide (MgO). The seed layer 32 is deposited prior to the layers shown above it and is used to establish the growth conditions and control the crystalline characteristics of layers following it. The first and second leads (31A, 31B) provide electrical connections for the flow of sensing current to a signal detector (not shown) that senses the change in resistance in the free layer 36 induced by the external magnetic field that is generated by the magnetic media.

Ferromagnetic materials most suitable for use as the pinned and free layers separated by the insulating tunnel barrier layer are materials with high spin polarization coefficients. Materials with high spin polarization coefficients near the tunneling junction are known to have higher magnetoresistance coefficients in MTJ sensors. A problem arises with some of the known materials that achieve the higher magnetoresistance coefficients is that they also may have high magnetostriction coefficients. When stressed the MTJ sensor layers with high magnetostriction coefficients can result in high uniaxial anisotropy fields in the pinned layer which can act to cancel part of the exchange field from the AFM layer resulting in reduced stability of the MTJ sensor especially at elevated operating temperatures. In addition, the stressed, high magnetostriction materials can result in high anisotropy fields in the free layer which reduces the sensitivity of the free layer to rotate in the presence of the external signal field. In order to eliminate undesirable magnetostriction, previous MTJ sensors have used ferromagnetic materials such as permalloy (Co90Fe10) which have very small magnetostriction coefficients, but which also have smaller magnetoresistance coefficients.

In U.S. Pat. No. 6,127,045 to Gill a magnetic tunnel junction (MTJ) device is described which has a high spin polarization ferromagnetic layer ($Ni_{40}Fe_{60}$) is placed near the tunnel barrier layer in both the pinned and free layers to enhance the magnetoresistive effect. The undesirable positive magnetostriction coefficient of the $Ni_{40}Fe_{60}$ layers is cancelled by placing a negative magnetostriction layer ($Ni_{90}Fe_{10}$) of the appropriate thickness adjacent to each $Ni_{40}Fe_{60}$ layer. The thicknesses of the positive and negative magnetostriction layers are chosen so that the net magnetostriction of the pinned layer and the free layer is approximately zero.

What is needed is a structure for an MTJ sensor which allows the use of materials for free layer that result in the highest magnetoresistive coefficients without degradation in sensitivity and thermal stability due to uncontrolled effects from magnetostrictive properties of these materials.

SUMMARY OF THE INVENTION

A tunnel junction sensor according to the invention replaces the prior art free layer with a free layer structure which allows a wider range of magnetoresistive materials to be used. The preferred free layer structure 40 of the invention includes a negative magnetostriction layer which allows use of magnetoresistive materials which otherwise have unacceptably high magnetostriction values. The materials and thicknesses of the layers result in a total magnetostriction near zero even though ferromagnetic material with high magnetostriction is included. This allows materials with high positive magnetoresistive constants such as $Co_{50}Fe_{50}$ and iron to be used in the free layer structure in contact with the barrier layer without the deleterious effects of high magnetostriction. In one embodiment, the invention uses bcc iron with a MgO barrier layer, since bcc iron yields particularly high magnetoresistive when used with a MgO barrier. In the preferred embodiment of the invention a layer of material with a negative magnetostriction constant such as nickel or an amorphous cobalt alloy is used to achieve a combined magnetostriction of near zero. The preferred embodiment also includes a softening layer of material such as selected compositions of nickel-iron which maintain the desired magnetic softness of the free layer structure and have a magnetostriction constant near zero.

DETAILED DESCRIPTION OF THE INVENTION AND THE PREFERRED EMBODIMENTS

Figure 1:
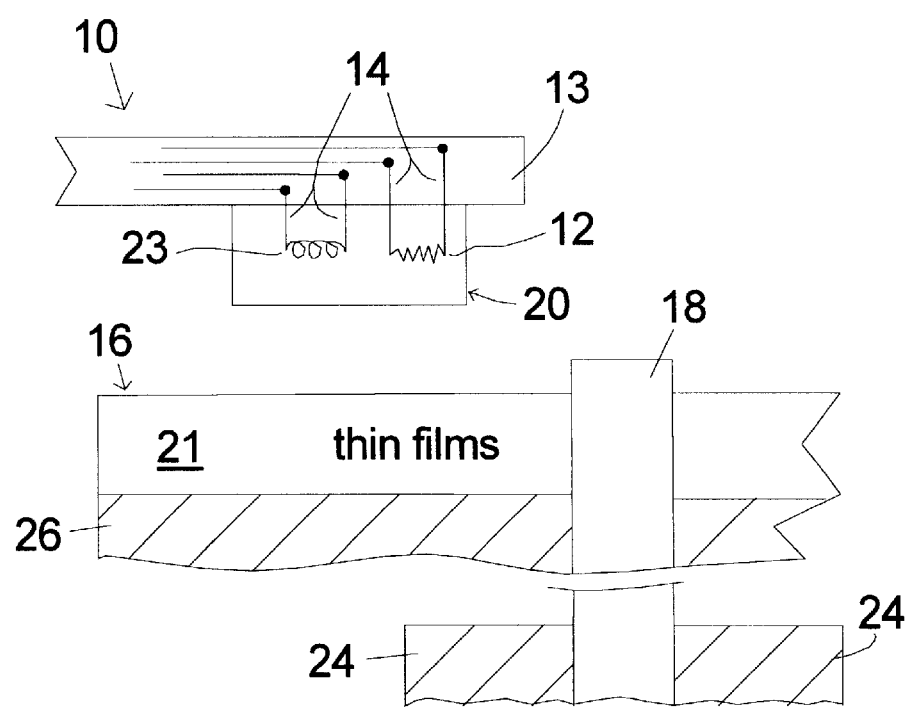
FIG. 1 is an illustration of the prior art showing the relationships between the head and associated components in a disk drive.
Figure 2:
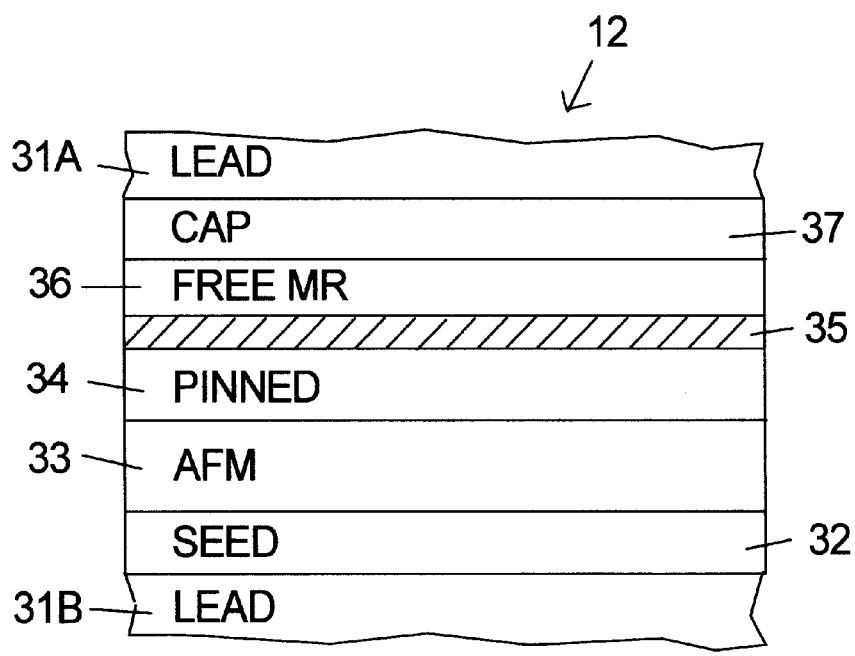
FIG. 2 is an illustration of the layer structure of a prior art tunnel junction sensor.

The invention will be described with reference to FIG. 3 which illustrates a section of read head 12 embodying the invention. In the read head 12 embodying the invention, the free layer 36 in the prior art head of FIG. 2 is replaced with the free layer structure 40 of the invention which includes three distinct layers of ferromagnetic material. The desirable properties for a free layer are high magnetoresistance, low magnetostriction and low coercivity (magnetic softness). Satisfying all three requirements at once, greatly limits the materials which can be used. The free layer structure 40 of the invention uses three layers to achieve higher magnetoresistive and an overall free layer performance superior to the prior art by allowing a wider selection of materials to be used for the magnetoresistive response. The free layer structure 40 of the invention includes a magnetoresistive layer 43 which can be a material that has good magnetoresistive response, although with relatively high positive magnetostriction, such as iron or $Co_{50}Fe_{50}$. Iron and $Co_{50}Fe_{50}$ are preferred over the $Co_{90}Fe_{10}$, which has been used in prior art MTJ sensors, because they have higher magnetoresistance especially when used with a MgO barrier layer 35. The magnetoresistive layer 43 is in contact with the barrier layer 35 and the magnetoresistive response is largely determined by the material nearest the interface with the barrier layer. It is this property of the tunnel junction structure which is exploited to allow the magnetostriction of the magnetoresistive layer 43 to be compensated in additional layers in the free layer structure 40. In one embodiment, the invention allows uses bcc iron to be used as magnetoresistive layer 43 with a MgO barrier layer 35. This is an advantage of the invention, since bcc iron yields particularly high magnetoresistive when used with a MgO barrier. A negative magnetostriction layer 41 is deposited in contact magnetoresistive layer 43. Preferably the negative magnetostriction layer 41 is nickel or an amorphous cobalt alloy, for example, $Co_{90}Nb_{10}$ which is known to have a negative magnetostriction coeficient. One advantage of using an amorphous material such as $Co_{90}Nb_{10}$ is that it provides a good surface for the soft magnetic material layer 42 which is deposited onto the negative magnetostriction layer 41 as discussed below. If the soft magnetic material layer 42 is a crystalline material such as nickel-iron, it is advantageous for the underlying layer to be amorphous to provide a neutral surface for the growth of its crystals.

The relative thicknesses of the layers in the free layer structure 40 are determined by the magnetostriction coeficients of the materials. In the preferred embodiment the ratio of the thicknesses will be approximately the same as the ratio of the magnetostriction coeficients in order to achieve near zero total magnetostriction for the magnetoresistive layer 43 combined with negative magnetostriction layer 41. For example, the magnetostriction coeficient of $Co_{50}Fe_{50}$ is about $+70 \times 10^{-6}$ and the magnetostriction coeficient of nickel is about $-35 \times 10^{-6}$. Therefore, near zero total magnetostriction will be obtained when the nickel layer is about twice as thick as the $Co_{50}Fe_{50}$ magnetoresistive layer. Other combinations of materials such as iron for the magnetoresistive layer 43 will require adjustments to the layer thicknesses in the free layer structure 40 according to their relative magnetostriction coeficients. The total thickness of the free layer structure 40 can be determined by prior art principles for tunnel junction sensors. The total thickness is inversely related to magnitude of the field to be detected, so as disk drive recording densities go higher, the thickness of the free layer structure goes down. As an example, an embodiment of the invention could have a 10 Angstroms thick $Co_{50}Fe_{50}$ layer and a 20 Angstroms thick nickel layer. Although the invention is not limited to any particular thicknesses, the preferred range is 5–50 Angstroms for the thickness of $Co_{50}Fe_{50}$ with the thickness of the nickel being adjusted accordingly.

One effect of adding a layer of a material like nickel is that of undesirably increasing the magnetic hardness (coercivity) of the structure, for example, the combined $Co_{50}Fe_{50}$ and nickel layers are magnetically harder than the $Co_{50}Fe_{50}$ layer standing alone. The addition of a soft magnetic material layer 42 softens the structure. The material and thickness of this additional layer must be selected with the goal of maintaining near zero magnetostriction for the overall free layer structure 40. Since some compositions of nickel and iron are both magnetically soft and have near zero magnetostriction, for example, $Ni_{80}Fe_{20}$, it is a preferred material for the soft magnetic material layer 42. In the embodiment using the 10 Angstroms $Co_{50}Fe_{50}$ layer and the 20 Angstroms nickel layer, 20 Angstroms of $Ni_{80}Fe_{20}$ could be added as the soft magnetic material layer 42.

As indicated above it is preferable that the first two layers of the free layer structure have near zero total magnetostriction and that the third softening layer have near zero magnetostriction. In alternative embodiments, it is possible for the soft magnetic material layer 42 to have a positive or negative magnetostriction coeficient, so as long as the combined magnetostriction of the three layer structure is near zero.

Except where express materials, thickness values, etc., have been given above, the layers, structures and materials in a head embodying the invention are according to the prior art and are fabricated according to the prior art.

Figure 3:
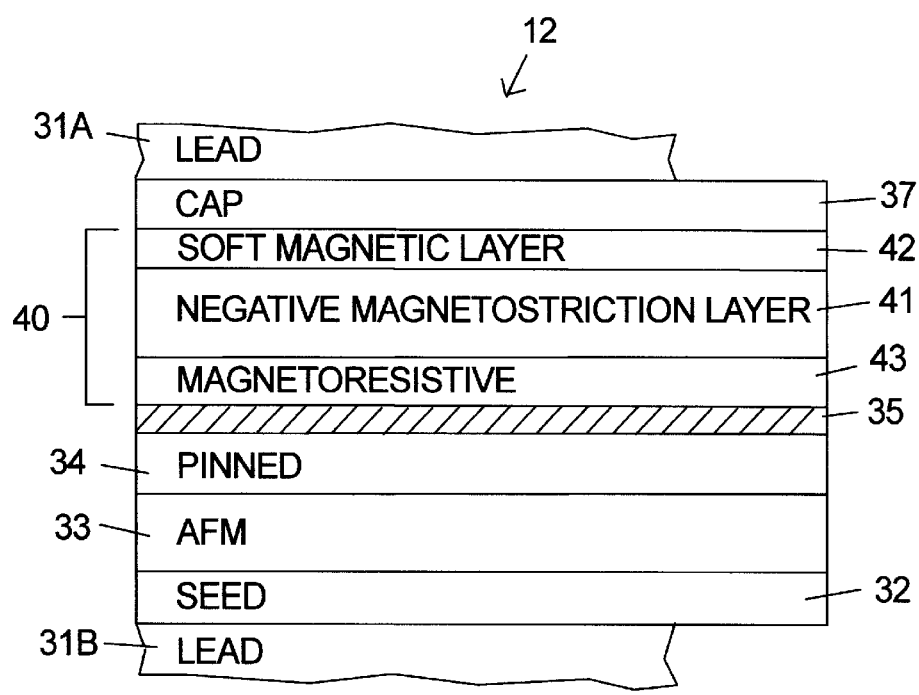
FIG. 3 is an illustration of the layer structures of a tunnel junction sensor according to the invention with a free layer structure according to the invention.

Sensors according to the invention can be fabricated in a magnetron sputtering or an ion beam sputtering system to sequentially deposit the multilayer structure shown in FIG. 3 beginning at the bottom and proceeding to the top. Thus, the barrier layer 35 is deposited before the magnetoresistive layer 43 and so forth. The method of manufacturing sensors according to the invention is in accordance with the prior art except as mentioned above.

The compositions given herein have been described without regard to small amounts of impurities that are inevitably present in practical embodiments as is well known to those skilled in the art.

Although the embodiments of the invention have been described in a particular MJT head structure, the magnetostriction compensation principles as described herein are not limited to this application. Those skilled in the art will recognize that the invention may be used in other magnetic sensors and other devices.

What is claimed is:

1. A thin film tunnel junction sensor for sensing an external magnetic field comprising:

an antiferromagnetic layer;

a pinned ferromagnetic layer;

a barrier layer in contact with the pinned ferromagnetic layer; and a free layer structure including:
   a first layer of ferromagnetic material disposed adjacent to the barrier layer and having a first magnetostriction value which is positive and a first coercivity;
   a second layer of ferromagnetic material having a second magnetostriction value which is negative and a second coercivity; and
   a third layer of ferromagnetic material having a third magnetostriction value and a third coercivity, the third coercivity being lower than the second coercivity and the first, second and third magnetostriction values summing to approximately zero.

2. The thin film tunnel junction sensor of claim 1 wherein the first layer of ferromagnetic material is iron.

3. The thin film tunnel junction sensor of claim 2 wherein the barrier layer is MgO.

4. The thin film tunnel junction sensor of claim 1 wherein the first layer of ferromagnetic material is $Co_{50}Fe_{50}$.

5. The thin film tunnel junction sensor of claim 4 wherein the barrier layer is MgO.

6. The thin film tunnel junction sensor of claim 1 wherein the second layer of ferromagnetic material is nickel.

7. The thin film tunnel junction sensor of claim 1 wherein the second layer of ferromagnetic material is an amorphous alloy of cobalt.

8. The thin film tunnel junction sensor of claim 1 wherein the second layer of ferromagnetic material is $Co_{90}Nb_{10}$.

9. The thin film tunnel junction sensor of claim 1 wherein the third layer of ferromagnetic material is $Ni_{80}Fe_{20}$.

10. The thin film tunnel junction sensor of claim 1 wherein the first layer of ferromagnetic material is $Co_{50}Fe_{50}$ and the second layer of ferromagnetic material is nickel.

11. The thin film tunnel junction sensor of claim 1 wherein the first layer of ferromagnetic material is $Co_{50}Fe_{50}$ and has a first thickness and the second layer of ferromagnetic material is nickel and has a second thickness which is approximately two times the first thickness.

12. The thin film tunnel junction sensor of claim 1 wherein the first layer of ferromagnetic material is $Co_{50}Fe_{50}$, the second layer of ferromagnetic material is nickel or an amorphous alloy of cobalt and the third layer of ferromagnetic material is an alloy of nickel and iron.

13. The thin film tunnel junction sensor of claim 1 wherein the first layer of ferromagnetic material is iron, the second layer of ferromagnetic material is nickel or an amorphous alloy of cobalt and the third layer of ferromagnetic material is an alloy of nickel and iron.

14. A method for fabricating a thin film tunnel junction sensor for sensing an external magnetic field comprising the steps of:

depositing an antiferromagnetic layer;

depositing a pinned ferromagnetic layer;

depositing a barrier layer in contact with the pinned ferromagnetic layer; and depositing a free layer structure including:
   a first layer of ferromagnetic material disposed adjacent to the barrier layer and having a first magnetostriction value which is positive and a first coercivity;
   a second layer of ferromagnetic material having a second magnetostriction value which is negative and a second coercivity; and
   a third layer of ferromagnetic material having a third magnetostriction value and a third coercivity, the third coercivity being lower than the second coercivity and the first, second and third magnetostriction values summing to approximately zero.

15. The method of claim 14 wherein the first layer of ferromagnetic material is iron or $Co_{50}Fe_{50}$.

16. The method of claim 15 wherein the barrier layer is MgO.

17. The method of claim 14 wherein the second layer of ferromagnetic material is nickel or an amorphous alloy of cobalt.

18. The method of claim 14 wherein the second layer of ferromagnetic material is $Co_{90}Nb_{10}$.

19. The method of claim 14 wherein the third layer of ferromagnetic material is $Ni_{80}Fe_{20}$.

20. The method of claim 14 wherein the first layer of ferromagnetic material is $Co_{50}Fe_{50}$ and has a first thickness and the second layer of ferromagnetic material is nickel and has a second thickness which is approximately two times the first thickness.

21. A disk drive comprising:

a thin film disk including a thin film of ferromagnetic material on a planar surface of the disk;

a spindle rotatably supporting the disk; and a tunnel junction magnetic sensor having an air bearing surface supported over the planar surface of the disk, the magnetic sensor including:
   a antiferromagnetic layer;
   a pinned layer;
   a barrier layer adjacent to the pinned layer;
   a magnetoresistive layer disposed adjacent to the barrier layer and having a first magnetostriction which is positive;
   a negative magnetostriction layer disposed adjacent to the magnetoresistive layer and having a second magnetostriction which is negative; and
   a softening ferromagnetic layer disposed adjacent to the negative magnetostriction layer, having a coercivity lower than a coercivity of the negative magnetostriction layer and having a third magnetostriction which results in approximately zero total magnetostriction when summed with the first and second magnetostriction.

22. The disk drive of claim 21 wherein the magnetoresistive layer is iron or $Co_{50}Fe_{50}$.

23. The disk drive of claim 22 wherein the barrier layer is MgO.

24. The disk drive of claim 21 wherein the negative magnetostriction layer is nickel or an amorphous alloy of cobalt.

25. The disk drive of claim 21 wherein the negative magnetostriction layer is $Co_{90}Nb_{10}$.

26. The disk drive of claim 21 wherein the softening ferromagnetic layer is $Ni_{80}Fe_{20}$.

* * * * *